US00RE49604E

(19) United States
(12) Reissued Patent
Kim et al.

(10) Patent Number: US RE49,604 E
(45) Date of Reissued Patent: Aug. 8, 2023

(54) ORGANIC LIGHT EMITTING DISPLAY DEVICE AND METHOD OF MANUFACTURING AN ORGANIC LIGHT EMITTING DISPLAY DEVICE

(71) Applicant: SAMSUNG DISPLAY CO., LTD., Yongin-si (KR)

(72) Inventors: Sun-Kwang Kim, Seoul (KR); Ki-Nyeng Kang, Sejong-si (KR); Jin-Koo Kang, Hwaseong-si (KR); Bek-Hyun Lim, Hwaseong-si (KR)

(73) Assignee: SAMSUNG DISPLAY CO., LTD., Yongin-si (KR)

(21) Appl. No.: 17/141,942

(22) Filed: Jan. 5, 2021

Related U.S. Patent Documents

Reissue of:
(64) Patent No.: 10,535,725
Issued: Jan. 14, 2020
Appl. No.: 16/239,704
Filed: Jan. 4, 2019

U.S. Applications:
(63) Continuation of application No. 15/625,480, filed on Jun. 16, 2017, now Pat. No. 10,199,448.

(30) Foreign Application Priority Data

Jun. 28, 2016 (KR) ..... 10-2016-0081089

(51) Int. Cl.
*H01L 51/52* (2006.01)
*H01L 27/32* (2006.01)
(Continued)

(52) U.S. Cl.
CPC ..... *H10K 59/131* (2023.02); *H01L 29/78645* (2013.01); *H10K 50/822* (2023.02);
(Continued)

(58) Field of Classification Search
CPC ..... H01L 27/3265; H01L 51/0023; H01L 27/3258; H01L 51/5253; H01L 29/78645;
(Continued)

(56) References Cited

U.S. PATENT DOCUMENTS

| | | | |
|---|---|---|---|
| 5,007,873 | A | 4/1991 | Goronkin et al. |
| 5,229,682 | A | 7/1993 | Komatsu |
| 6,190,930 | B1 | 2/2001 | Williams |
| 7,122,956 | B2 | 10/2006 | Ikeda et al. |

(Continued)

FOREIGN PATENT DOCUMENTS

| | | |
|---|---|---|
| JP | 2005-071656 | 3/2005 |
| KR | 10-2013-0053053 | 5/2013 |

(Continued)

OTHER PUBLICATIONS

Translation of KR-10-2017-0019553 (Year: 2017).*

*Primary Examiner* — Ling X Xu
(74) *Attorney, Agent, or Firm* — F. Chau & Associates, LLC

(57) ABSTRACT

An organic light emitting display (OLED) device includes a substrate comprising a display region and a peripheral region. The OLED device further includes a conductive layer disposed in the peripheral region on the substrate and including an opening portion exposing at least a portion of the substrate, the conductive layer having an undercut shape. The OLED device additionally includes an insulation layer disposed on the conductive layer, the insulation layer including an opening that exposes the opening portion. The OLED device further includes a common layer disposed in both the display region and the peripheral region on the insulation layer and on the substrate exposed by the opening portion. The common layer disposed on the substrate exposed by the opening portion is spaced apart from the common layer disposed on the insulation layer.

36 Claims, 19 Drawing Sheets

(51) Int. Cl.

| | |
|---|---|
| ***H10K 59/131*** | (2023.01) |
| ***H01L 29/786*** | (2006.01) |
| ***H10K 50/822*** | (2023.01) |
| ***H10K 50/844*** | (2023.01) |
| ***H10K 59/124*** | (2023.01) |
| ***H10K 59/121*** | (2023.01) |
| ***H10K 71/00*** | (2023.01) |
| *H01L 27/12* | (2006.01) |
| *H10K 50/813* | (2023.01) |
| *H10K 59/12* | (2023.01) |

(52) U.S. Cl.
CPC ..... *H10K 50/844* (2023.02); *H10K 59/124* (2023.02); *H10K 59/1216* (2023.02); *H10K 71/00* (2023.02); *H10K 71/621* (2023.02); *H01L 27/124* (2013.01); *H10K 50/813* (2023.02); *H10K 59/1201* (2023.02); *H10K 59/1213* (2023.02)

(58) Field of Classification Search
CPC . H01L 27/3276; H01L 51/5225; H01L 51/56; H01L 27/3262; H01L 27/124; H01L 51/5209; H01L 2227/323
See application file for complete search history.

(56) References Cited

U.S. PATENT DOCUMENTS

| | | | |
|---|---|---|---|
| 10,199,448 | B2 | 2/2019 | Kim et al. |
| 10,535,725 | B2 | 1/2020 | Kim et al. |
| 2005/0127828 | A1 | 6/2005 | Chung et al. |
| 2007/0087468 | A1 | 4/2007 | Doll et al. |
| 2007/0087488 | A1 | 4/2007 | Doll et al. |
| 2009/0115066 | A1 | 5/2009 | Yang et al. |
| 2009/0251047 | A1 | 10/2009 | Lee et al. |
| 2010/0123125 | A1 | 5/2010 | Lee et al. |
| 2010/0171419 | A1 | 7/2010 | Kim et al. |
| 2012/0086881 | A1 | 4/2012 | Kim et al. |
| 2013/0087794 | A1 | 4/2013 | Kwack |
| 2016/0141341 | A1 | 5/2016 | Kajiyama et al. |
| 2017/0256754 | A1 | 9/2017 | Defranco et al. |
| 2017/0373129 | A1 | 12/2017 | Kim et al. |

FOREIGN PATENT DOCUMENTS

| | | |
|---|---|---|
| KR | 10-2016-0016339 | 2/2016 |
| KR | 10-2017-0019553 | 2/2017 |
| KR | 10-2017-0059527 | 5/2017 |
| KR | 10-2017-0059864 | 5/2017 |

* cited by examiner

ORGANIC LIGHT EMITTING DISPLAY DEVICE AND METHOD OF MANUFACTURING AN ORGANIC LIGHT EMITTING DISPLAY DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application is a continuation of U.S. patent application Ser. No. 15/625,480 filed on Jun. 16, 2017, which claims priority under 35 USC § 119 to Korean Patent Application No. 10-2016-0081089 filed on Jun. 28, 2016 in the Korean Intellectual Property Office (KIPO), the disclosures of which are incorporated by reference herein in their entireties.

TECHNICAL FIELD

Exemplary embodiments of the present invention relate to a display device. More particularly, exemplary embodiments of the present inventive concept relate to an organic light emitting display (OLED) device and a method of manufacturing the OLED device.

DISCUSSION OF THE RELATED ART

Organic light emitting display (OLED) devices are widely used as a display device for displaying images. The OLED device might not require a separate light source, and thus, the OLED device may be relatively thin, may be relatively light in weight, and may have a relatively low power consumption. Furthermore, the OLED device may have a wide viewing angle, a high contrast, and a high response speed, etc.

However, in a conventional OLED device, an organic light emitting layer included in an organic light emitting structure may degrade because of moisture and/or oxygen penetrating the OLED device from outside.

SUMMARY

Exemplary embodiments of the present invention provide an organic light emitting display (OLED) device in which an inflow path of moisture and/or oxygen is blocked.

Exemplary embodiments of the present invention provide a method of manufacturing an OLED device for blocking an inflow path of moisture and/or oxygen.

According to an exemplary embodiment of the present invention, an organic light emitting display (OLED) device includes a substrate including a display region and a peripheral region. The OLED device further includes a conductive layer disposed in the peripheral region on the substrate and including an opening portion exposing at least a portion of the substrate, the conductive layer having an undercut shape. The OLED device additionally includes an insulation layer disposed on the conductive layer, the insulation layer including an opening that exposes the opening portion. The OLED device further includes a common layer disposed in both the display region and the peripheral region on the insulation layer and on the substrate exposed by the opening portion. The common layer disposed on the substrate exposed by the opening portion is spaced apart from the common layer disposed on the insulation layer.

According to an exemplary embodiment of the present invention, a method of manufacturing an organic light emitting display device includes forming a conductive layer in a peripheral region on a substrate and forming an insulation layer on the substrate, the insulation layer covering the conductive layer. The method further includes etching the insulation layer to expose a portion of the conductive layer. The method additionally includes etching the conductive layer to form an opening portion in the conductive layer, the conductive layer having an undercut shape. The method further includes forming a common layer on the insulation layer and on the substrate in the opening portion. The common layer formed on the substrate in the opening portion is spaced apart from the common layer formed on the insulation layer.

According to an exemplary embodiment of the present invention, an organic light emitting display (OLED) device includes a substrate including a first region and a second region. The OLED further includes a conductive layer disposed on the substrate in the second region thereof and including an opening portion exposing at least a portion of the substrate. The opening portion has a semi-circular shape. The OLED additionally includes an insulation layer disposed on the conductive layer and including an opening that corresponds to the opening portion. The OLED further includes a common layer disposed in both the first region and the second region. In the second region, the common layer includes a first portion and a second portion. The first portion is disposed on the insulation layer and the second portion is disposed on the substrate exposed by the opening portion.

The OLED device according to an exemplary embodiment of the present invention may include the conductive layer including the opening portion, may have an undercut shape, and may include the insulation layer covering the conductive layer. Therefore, the common layer disposed in the opening portion of the conductive layer may be spaced apart from the common layer disposed on the insulation layer, so that the inflow path of moisture and/or oxygen may be blocked in the peripheral region.

BRIEF DESCRIPTION OF THE DRAWINGS

The above and other features of the invention will become more apparent by describing in detail exemplary embodiments thereof, with reference to the accompanying, in which.

DETAILED DESCRIPTION OF THE EMBODIMENTS

Exemplary embodiments of the present invention will be described in more detail below with reference to the accompanying drawings, in which exemplary embodiments of the preset invention are shown.

Figure 1:
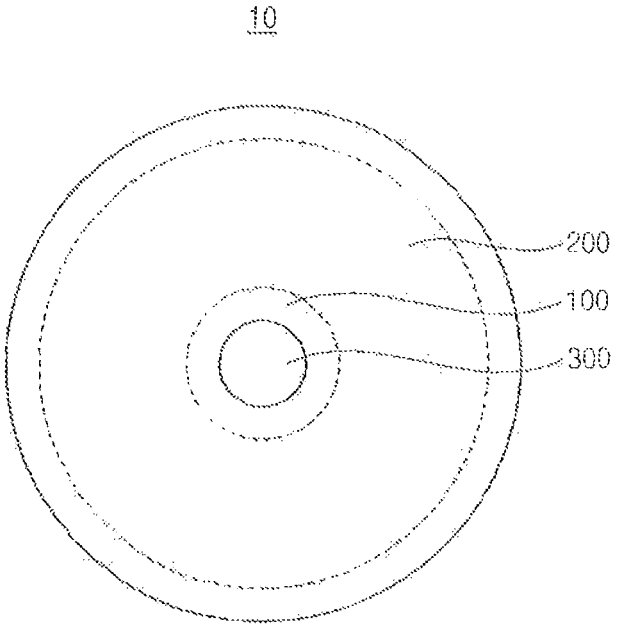
FIGS. 1 and 2 are plan views roughly illustrating an OLED device according to an exemplary embodiment of the present invention.
Figure 2:
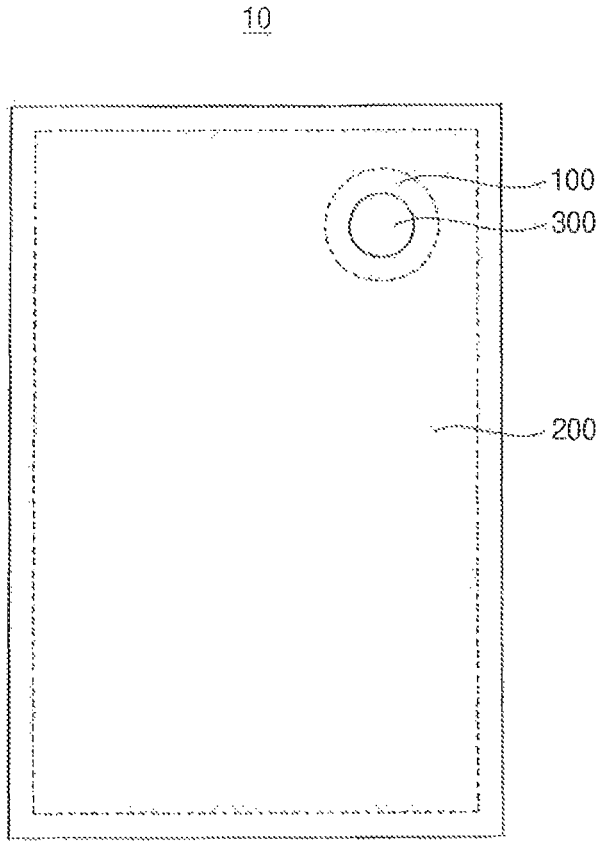

FIGS. 1 and 2 are plan views roughly illustrating an OLED device according to an exemplary embodiment of the present invention.

Referring to FIGS. 1 and 2, an OLED device 10 according to an exemplary embodiment of the present invention may include a display region 200, a peripheral region 100, and an opening region 300. The display region 200 may display an image. A plurality of pixels for emitting light may be disposed in the display region 200 to display the image.

The opening region 300 may be a region in which compositions of the OLED device 10, such as a camera, a sensor, a speaker, etc., may be disposed. After disposing insulation layers, conductive layers, organic layers, etc. on a substrate, a hole may be formed therein to provide the opening region 300.

FIGS. 1 and 2 illustrate that the opening region 300 has a circular shape. However, the present invention is not limited thereto. For example, the opening region 300 may have a polygonal shape such as a quadrilateral shape, a triangle shape, etc.

The peripheral region 100 may surround the display region 200, and/or may be disposed between the display region 200 and the opening region 300. For example, in an exemplary embodiment of the present invention, the display region 200 may surround the peripheral region 100. However, in an exemplary embodiment of the present invention, the peripheral region 100 may partially surround the display region 200. A driving circuit for providing driving signals, e.g., a data signal, a gate signal, etc., to the pixels may be disposed in the peripheral region 100.

Figure 3:
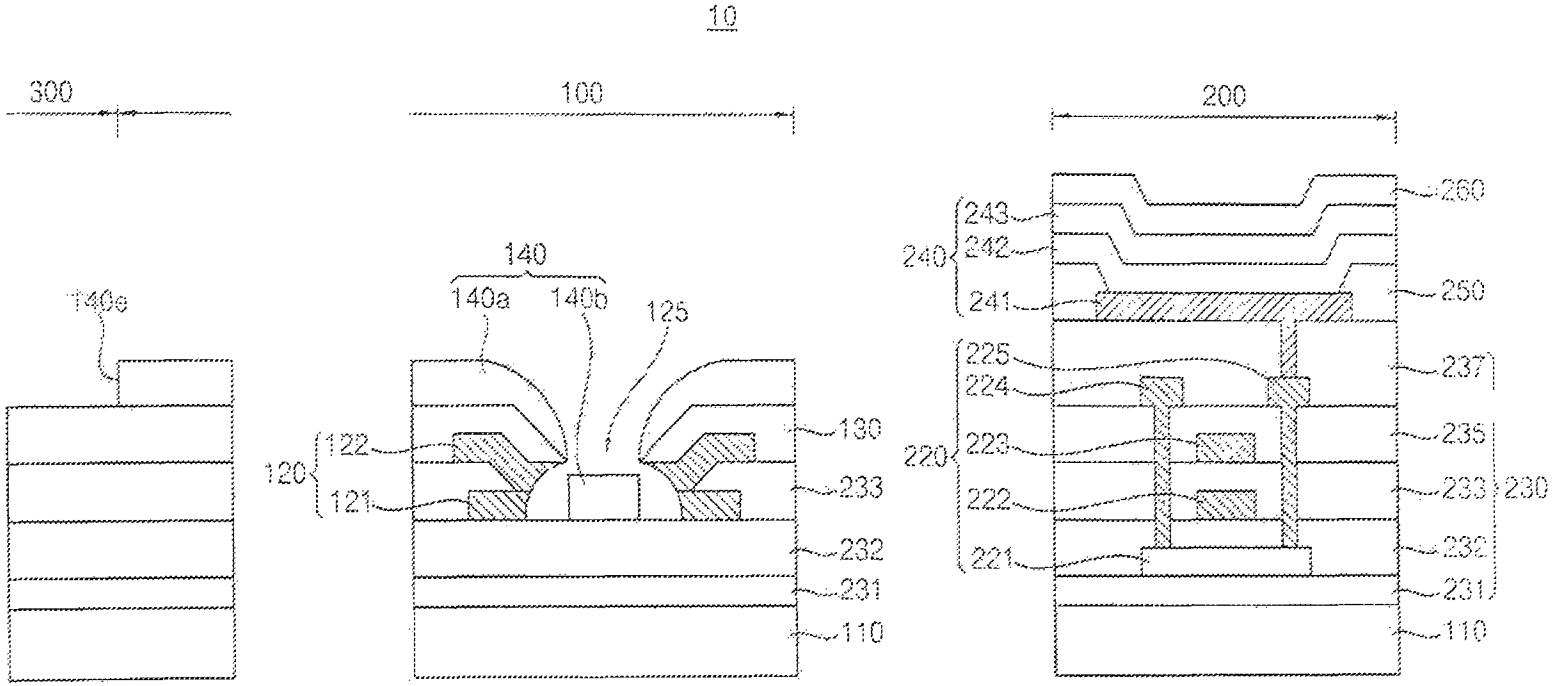
FIGS. 3 and 4 are cross-sectional views illustrating an OLED device according to an exemplary embodiment of the present invention.
Figure 4:
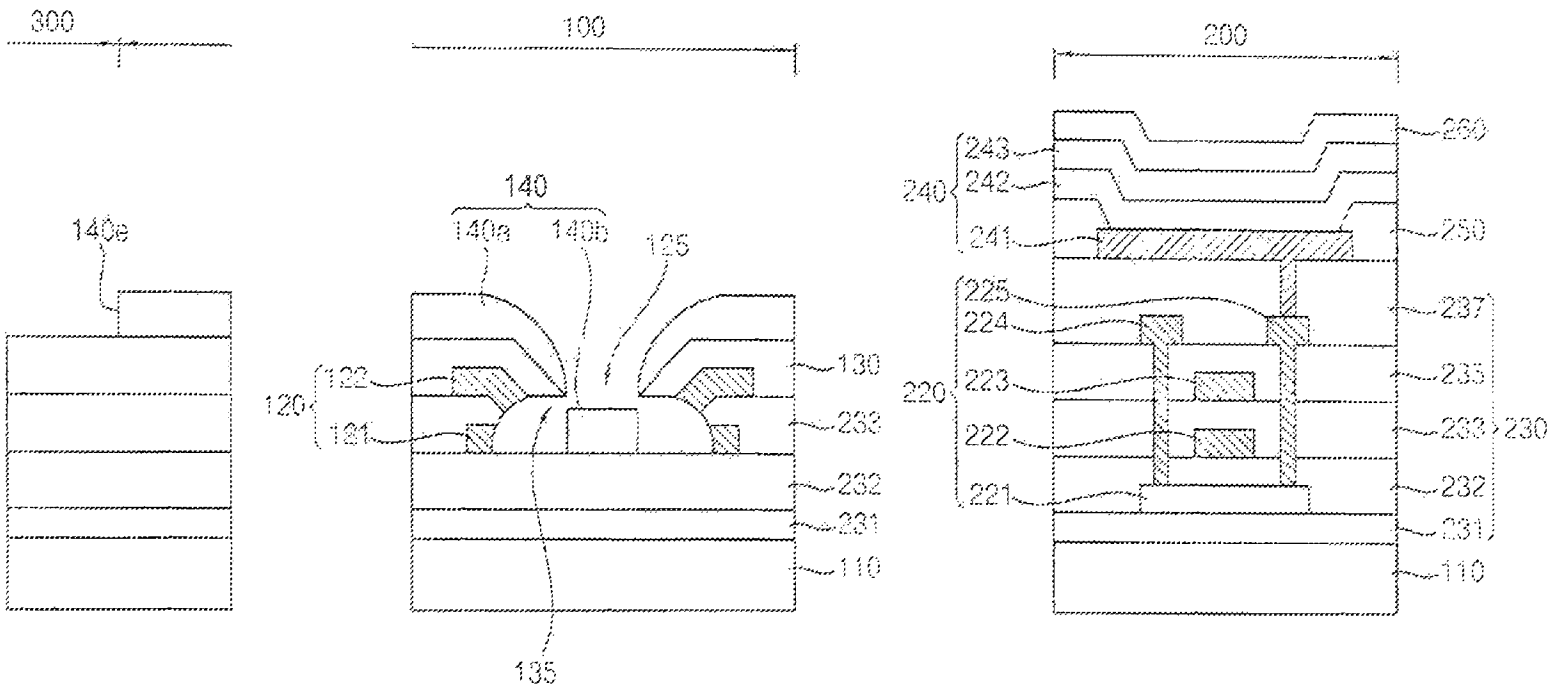

FIGS. 3 and 4 are cross-sectional views illustrating an OLED device according to an exemplary embodiment of the present invention.

Referring to FIG. 3, an OLED device 10 according to an exemplary embodiment of the present invention may include a substrate 110, a switching structure 220 disposed in the display region 200 of the substrate 110, an insulation structure 230 covering the switching structure 220, and an organic light emitting structure 240 disposed on the insulation structure 230. In an exemplary embodiment, the OLED device 10 may further include a capping layer 260 disposed on the organic light emitting structure 240. However, in an exemplary embodiment of the present invention, the capping layer 260 may be omitted.

The substrate 110 may be a transparent insulating substrate. For example, the substrate 110 may be made of a glass, a plastic having transparency and flexibility, etc.

In an exemplary embodiment, the switching structure 220 may include an active pattern 221, a first gate electrode 222, a second gate electrode 223, a source electrode 224, and a drain electrode 225. The first gate electrode 222 and the second gate electrode 223 may be sequentially stacked on the substrate 110. The switching structure 220 may transmit a driving current to the organic light emitting structure 240 in response to a gate signal. The switching structure 220 may be, for example, a transistor.

The active pattern 221 may be disposed on the substrate 110. In an exemplary embodiment of the present invention, the active pattern 221 may include a silicon compound such as a polysilicon. However, the present invention is not limited thereto. In an exemplary embodiment of the present invention, the active pattern 221 may include an oxide semiconductor such as indium gallium zinc oxide (IGZO), zinc tin oxide (ZTO), or indium tin zinc oxide (ITZO).

The first gate electrode 222 may be disposed on the active pattern 221. The first gate electrode 222 may at least partially overlap the active pattern 221. The second gate electrode 223 may be disposed on the first gate electrode 222. The second gate electrode 223 may at least partially overlap the first gate electrode 222. The second gate electrode 223 may be substantially aligned with the first gate electrode 222. The source electrode 224 and the drain electrode 225 may be disposed on the active pattern 221. The source electrode 224 and the drain electrode 225 may be disposed on substantially the same level on the substrate 110. For example, the source electrode 224 and the drain electrode 225 may be disposed on the same layer.

In an exemplary embodiment of the present invention, each of the first gate electrode 222, the second gate electrode 223, the source electrode 224, and the drain electrode 225 may include a metal such as silver (Ag), magnesium (Mg), aluminum (Al), tungsten (W), copper (Cu), nickel (Ni), chromium (Cr), molybdenum (Mo), titanium (Ti), platinum (Pt), tantalum (Ta), neodymium (Nd), scandium (Sc), an alloy thereof, a nitride thereof, etc. These may be used alone or in a combination thereof.

A transistor may include the active pattern 221, the first gate electrode 222, the source electrode 224, and the drain electrode 225. A capacitor may include the first gate electrode 222 and the second gate electrode 223.

In an exemplary embodiment of the present invention, the insulation structure 230 may include a buffer layer 231, a first gate insulation layer 232, a second gate insulation layer 233, an insulation interlayer 235, and a planarization layer 237.

The buffer layer 231 may be disposed on the substrate 110. After moisture and/or impurities have penetrated through the substrate 110, the buffer layer 231 may prevent moisture and/or impurities from penetrating structures disposed on the substrate 110.

The first gate insulation layer 232 may be disposed on the buffer layer 231, and may cover the active pattern 221. The first gate insulation layer 232 may insulate the first gate electrode 222 from the active pattern 221. The second gate insulation layer 233 may be disposed on the first gate insulation layer 232, and may cover the first gate electrode 222. The second gate insulation layer 233 may insulate the second gate electrode 223 from the first gate electrode 222. The insulation interlayer 235 may be disposed on the second gate insulation layer 233, and may cover the second gate electrode 223. The insulation interlayer 235 may insulate the source and the drain electrodes 224 and 225 from the second gate electrode 223.

In an exemplary embodiment of the present invention, each of the buffer layer 231, the first gate insulation layer 232, the second gate insulation layer 233, and the insulation interlayer 235 may include silicon oxide, silicon nitride, or silicon oxynitride.

The planarization layer 237 may be disposed on the insulation interlayer 235, and may cover the source electrode 224 and the drain electrode 225. The planarization layer 237 may provide a substantially flat surface to structures disposed thereon. The planarization layer 237 may accommodate a via structure penetrating the planarization layer 237 electrically connecting a pixel electrode 241, which may be disposed on the planarization layer 237, to the drain electrode 225.

In an exemplary embodiment of the present invention, the planarization layer 237 may include organic material such as polyimide, epoxy based resin, acryl based resin, polyester, etc. The planarization layer 237 may be disposed in the display region 200. For example, the planarization layer 237 might not be disposed in the peripheral region 100.

In an exemplary embodiment of the present invention, the organic light emitting structure 240 may include the pixel electrode 241, a display layer 242, and an opposing electrode 243.

The pixel electrode 241 may be disposed on the planarization layer 237. For example, the pixel electrode 241 may be an anode of the organic light emitting structure 240.

In an exemplary embodiment of the present invention, the pixel electrode 241 may include a metal such as Ag, Mg, Al, W, Cu, Ni, Cr, Mo, Ti, Pt, Ta, Nd, Sc, an alloy thereof, etc. However, the present invention is not limited thereto. In an exemplary embodiment of the present invention, the pixel electrode 241 may include a transparent conductive material having a relatively high work function. For example, the pixel electrode 241 may include indium tin oxide (ITO), indium zinc oxide (IZO), zinc oxide, or indium oxide.

A pixel defining layer 250 may be disposed on the planarization layer 237, and may cover a portion, e.g., an edge portion, of the pixel electrode 241. For example, the pixel defining layer 250 may include a transparent organic material such as polyimide resin or acryl resin. The pixel defining layer 250 may be disposed in the display region 200. For example, the pixel defining layer 250 might not be disposed in the peripheral region 100.

The opposing electrode 243 may be disposed on the pixel electrode 241. Further, the display layer 242 may be disposed between the opposing electrode 243 and the pixel electrode 241. For example, the opposing electrode 243 may be a cathode of the organic light emitting structure 240.

In an exemplary embodiment of the present invention, the opposing electrode 243 may include a metal having a relatively low work function, such as Ag, Mg, Al, W, Cu, Ni, Cr, Mo, Ti, Pt, Ta, Nd, Sc, an alloy thereof, etc.

The display layer 242 may be disposed between the pixel electrode 241 and the opposing electrode 243. For example, the display layer 242 may be disposed on the pixel defining layer 250 and the exposed pixel electrode 241.

The display layer 242 may include an organic light emitting layer. The organic light emitting layer may include a host material that emits light when the electrons and holes recombine in the organic light emitting layer when a voltage is applied to the organic light emitting structure 240. The organic light emitting layer may include a dopant material that facilitates energy absorbance and release, and improves light emitting efficiency. In an exemplary embodiment of the present invention, the organic light emitting layer may be patterned for each of the pixels. For example, each organic light emitting layer may be patterned differently for each of the pixels. In an exemplary embodiment, the organic light emitting layer may be patterned substantially the same for the plurality of pixels.

In an exemplary embodiment of the present invention, the display layer 242 may further include a hole transport layer (HTL) disposed between the pixel electrode 241 and the organic light emitting layer, and an electron transport layer (ETL) disposed between the organic light emitting layer and the opposing electrode 243. For example, the HTL may include a hole transport material, and the ETL may include an electron transport material. In an exemplary embodiment of the present invention, the HTL and the ETL may be patterned substantially the same for the plurality of pixels.

The capping layer 260 may be disposed on the opposing electrode 243. The capping layer 260 may increase light emitting efficiency of light emitted from the organic light emitting layer.

The capping layer 260 may include an organic material having relatively high transparency. For example, the capping layer 260 may include a material substantially the same as the hole transport material.

In an exemplary embodiment of the present invention, at least one of the display layer 242, the opposing electrode 243, and the capping layer 260 may extend from the display region 200 to the peripheral region 100. For example, at least one of the display layer 242, the opposing electrode 243, and the capping layer 260 may correspond to a common layer 140 as described below.

As illustrated in FIG. 3, the common layer 140 may extend to a boundary between the peripheral region 100 and the opening region 300, and the common layer 140 may have a side portion 140e (e.g., side surface) located at the boundary between the peripheral region 100 and the opening region 300. The side portion 140e of the common layer 140 may be exposed to the outside, and moisture and/or oxygen may flow into the common layer 140 through the side portion 140e from the outside. If moisture and/or oxygen flow into the display region 200 through the common layer 140, the pixels may degrade. Thus, blocking an inflow path of moisture and/or oxygen may reduce the degradation of the pixels.

The OLED device 10 according to an exemplary embodiment of the present invention may include a conductive layer 120 disposed in the peripheral region 100 on the substrate 110, an insulation layer 130 disposed on the conductive layer 120, and the common layer 140 disposed on the insulation layer 130. For example, the insulation layer 130 may be covering the conductive layer 120.

As described above, the buffer layer 231 and the first gate insulation layer 232 extended from the display region 200 and to the peripheral region 100 may be disposed on the substrate 110.

The conductive layer 120 may be disposed on the substrate 110. For example, the conductive layer 120 may be disposed on the first gate insulation layer 232. An opening portion 125 may be formed in the conductive layer 120. The opening portion 125 may expose lower structures under the conductive layer 120. For example, the first gate insulation layer 232 may be exposed by the opening portion 125. The conductive layer 120 may have an undercut shape. For example, a width of the opening portion 125 may substantially increase from an upper portion to an lower portion of the conductive layer 120. As an additional example, side surfaces of the conductive layer 120 exposed to the opening portion 125 may be curved. As another example, the opening portion 125 may have a semi-circular shape.

In an exemplary embodiment of the present invention, the conductive layer 120 may include a first conductive layer 121 and a second conductive layer 122. For example, the first conductive layer 121 may be disposed on the first gate insulation layer 232. The second gate insulation layer 233 may be disposed on the first gate insulation layer 232, and may at least partially cover the first conductive layer 121. An opening may be formed in the second gate insulation layer 233. The opening may expose a portion of the first conductive layer 121. The second conductive layer 122 may be disposed on the second gate insulation layer 232. The second conductive layer 122 may be in contact with the first conductive layer 121 through the opening exposing a portion of the first conductive layer 121.

The insulation layer 130 may be disposed on the conductive layer 120. For example, the insulation layer 130 may be disposed on the second gate insulation layer 233, and may cover the second conductive layer 122. The insulation layer 130 may be patterned to form an opening that exposes the opening portion 125 of the conductive layer 120. For example, a width of the opening may substantially decrease from an upper portion to an lower portion of the insulation layer 130.

The common layer 140 may be disposed on the insulation layer 130 and on the first gate insulation layer 232 exposed by the opening portion 125. The common layer 140 may include a first portion 140a disposed on the insulation layer 130, and a second portion 140b disposed on the first gate insulation layer 232 exposed by the opening portion 125.

The second portion 140b of the common layer 140 may be spaced apart from the first portion 140a of the common layer 140. The first portion 140a of the common layer 140 may be disposed on a sidewall of the patterned insulation layer 130 such that the first portion 140a of the common layer 140 corresponds to the patterned insulation layer 130. For example, the first portion 140a may be patterned similar to the patterned insulation layer 130 such that the first portion 140a may include an opening. However, the first portion 140a of the common layer 140 might not be disposed on the conductive layer 120 that has an undercut shape. Therefore, the common layer 140 may be divided into the first and the second portions 140a and 140b.

In an exemplary embodiment of the present invention, the thickness of the conductive layer 120 may be greater than the thickness of the common layer 140. In this case, the difference of height between a bottom of the first portion 140a of the common layer 140 and a top of the first gate insulation layer 232 may be greater than or equal to the thickness of the conductive layer 120. Thus, the first portion 140a of the common layer 140 may be spaced apart from the second portion 140b of the common layer 140 disposed in the opening portion 125 that has the thickness less than that of the conductive layer 120.

Referring to FIG. 4, in an exemplary embodiment of the present invention, at least a portion of a bottom surface of the insulation layer 130 may be exposed by the opening portion 125 and another a portion of the bottom surface of the insulation layer 130 may cover the conductive layer 120. For example, the width of the opening portion 125 may increase so that the separation of the common layer 140 may occur more easily.

Referring to FIG. 3 again, in an exemplary embodiment of the present invention, the first conductive layer 121 and the second conductive layer 122 may be disposed on substantially the same level on the substrate 110 with the first gate electrode 222 and the second gate electrode 200, respectively. The insulation layer 130 may correspond to the insulation interlayer 235. For example, the insulation layer 130 may be a portion of the insulation interlayer 235 that extends from the display region 200 to the peripheral region 100. Further, the insulation layer 130 and the insulation interlayer 235 may be disposed on substantially the same level on the substrate 110.

Figure 5:
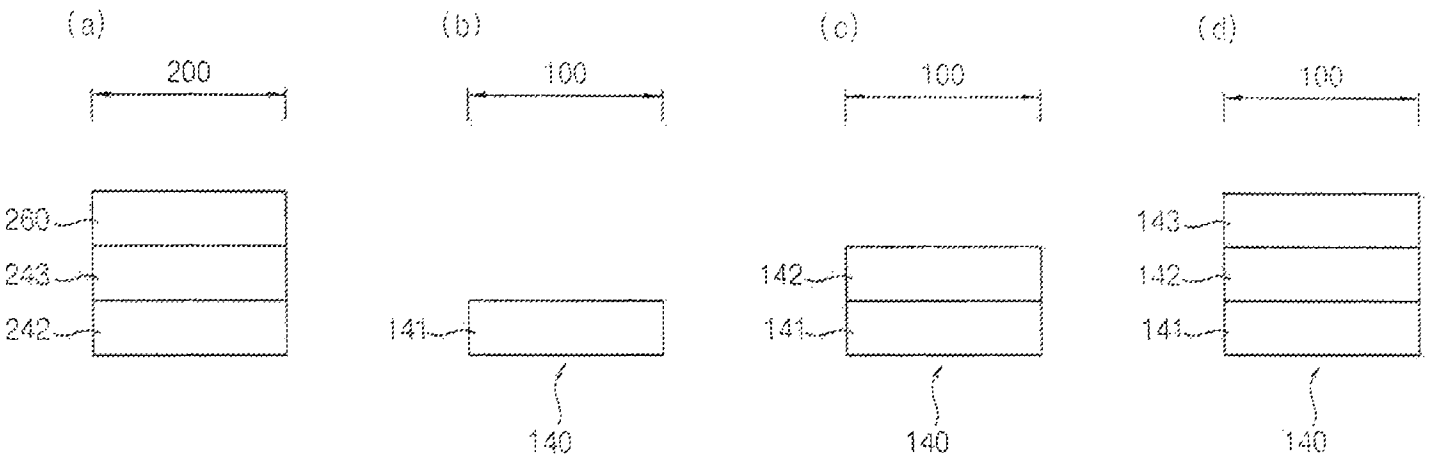
FIG. 5 is a cross-sectional view illustrating compositions of an OLED device according to an exemplary embodiment of the present invention.

FIG. 5 is a cross-sectional view illustrating compositions of an OLED device according to an exemplary embodiment of the present invention.

Referring to FIG. 5a, the display layer 242, the opposing electrode 243, and the capping layer 260 may be stacked in the display region 200. In an exemplary embodiment of the present invention, the common layer 140 disposed in the peripheral region 100 may correspond to at least one of the display layer 242, the opposing electrode 243, and the capping layer 260. For example, the common layer 140 may be a single layer structure or a multi-layer structure.

Referring to FIG. 5b, the common layer 140 may include a first common layer 141. The common layer 140 may correspond to one of the display layer 242, the opposing electrode 243, and the capping layer 260. In an exemplary embodiment of the present invention, the first common layer 141 may correspond to the opposing electrode 243. For example, the first common layer 141 disposed in the peripheral region 100 may be disposed on the same layer as the opposing electrode 243 disposed in the display region 200. However, the present invention is not limited thereto, and the first common layer 141 may correspond to other layers in the display region 100 such as the display layer 242.

Referring to FIG. 5c, the common layer 140 may include a first common layer 141 and a second common layer 142 disposed on the first common layer 141. The common layer 140 may correspond to two of the display layer 242, the opposing electrode 243, and the capping layer 260. In an exemplary embodiment of the present invention, the first common layer 141 may correspond to the display layer 242, and the second common layer 142 may correspond to the opposing electrode 243. In an exemplary embodiment of the present invention, the first common layer 141 may correspond to the opposing electrode 243, and the second common layer 142 may correspond to the capping layer 260.

Referring to FIG. 5d, the common layer 140 may include a first common layer 141, a second common layer 142 disposed on the first common layer 141, and a third common layer 143 disposed on the second common layer 142. The common layer 140 may correspond to the display layer 242, the opposing electrode 243, and the capping layer 260. In an exemplary embodiment of the present invention, the first common layer 141 may correspond to the display layer 242, the second common layer 142 may correspond to the opposing electrode 243, and the third common layer 143 may correspond to the capping layer 260.

FIGS. 6 to 10 are cross-sectional views illustrating an OLED device according to an exemplary embodiment of the present invention.

Referring to FIGS. 6 to 10, the conductive layer 120 may be disposed on the substrate 110. As described above, the opening portion 125 may be formed in the conductive layer 120, and the conductive layer 120 may have an undercut shape. Unlike the OLED device 10 according to an exemplary embodiment of the present invention described above with reference to FIG. 3, the OLED device 10 according to an exemplary embodiment of the present invention with reference to FIGS. 6 to 10 may include the conductive layer 120 including one conductive layer 120 (e.g., being a single layer structure).

Figure 6:
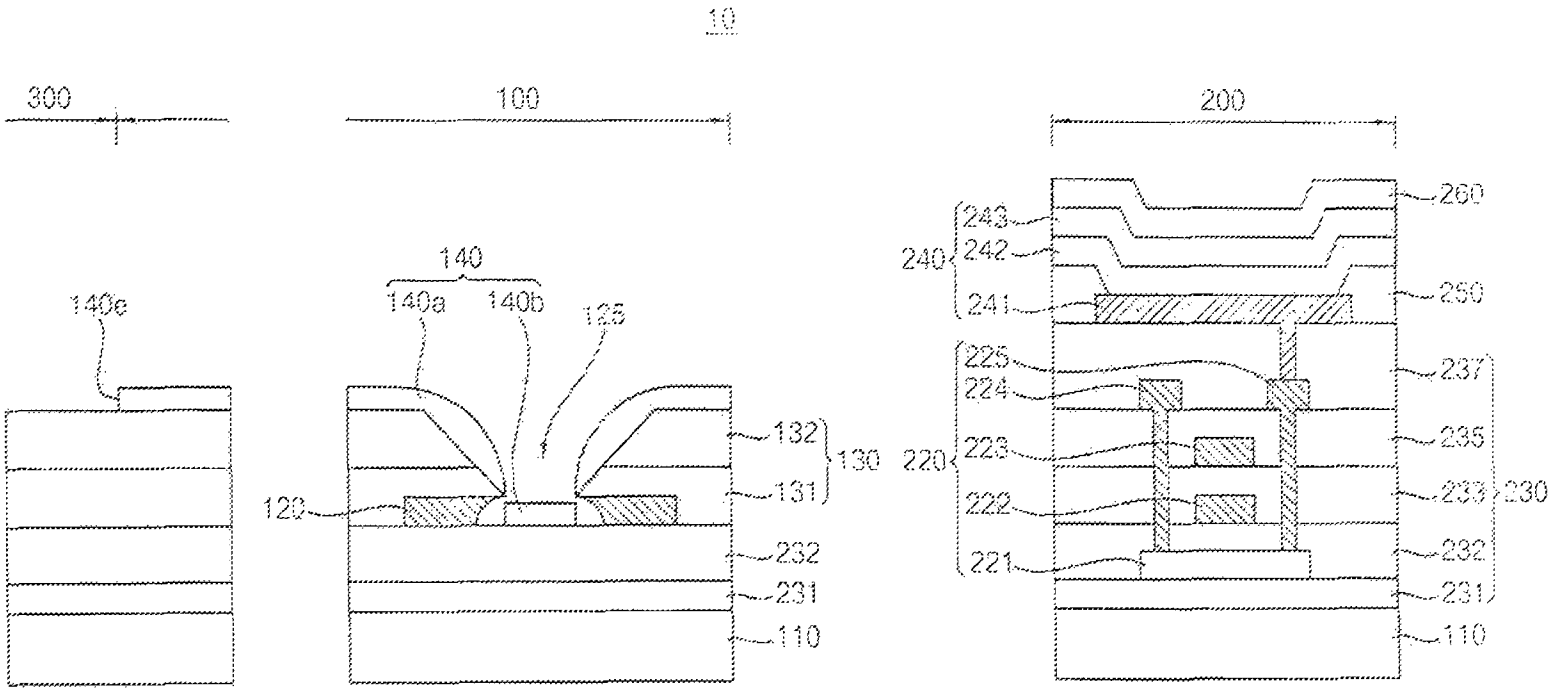
FIGS. 6 to 10 are cross-sectional views illustrating an OLED device according to an exemplary embodiment of the present invention.

As illustrated in FIG. 6, the conductive layer 120 may be disposed on the first gate insulation layer 232. In an exemplary embodiment of the present invention, the conductive layer 120 may be disposed on substantially the same level on the substrate 110 as the first gate electrode 222 disposed in the display region 200.

The insulation layer 130 may be disposed on the conductive layer 120. For example, the insulation layer 130 may be disposed on the first gate insulation layer 232, and may cover the conductive layer 120. In an exemplary embodiment of the present invention, the insulation layer 130 may include a first insulation layer 131 and a second insulation layer 132 disposed on the first insulation layer 131. The first insulation layer 131 may correspond to the second gate insulation layer 233, and the second insulation layer 132 may correspond to the insulation interlayer 235. For example, the first insulation layer 131 may be a portion of the second gate insulation layer 233 that extends from the display region 200 to the peripheral region 100, and the second insulation layer 132 may be a portion of the insulation interlayer 235 that extends from the display region 200 to the peripheral region 100.

Figure 7:
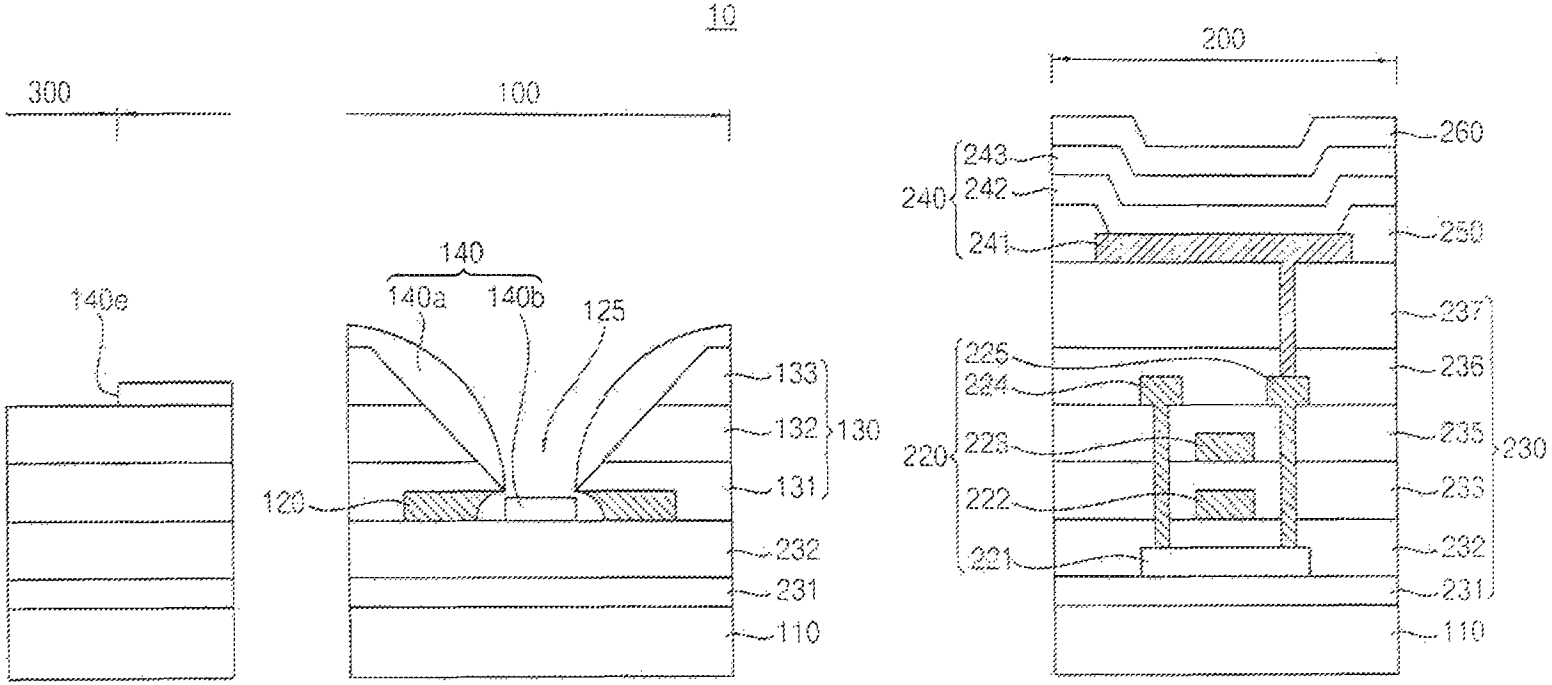

As illustrated in FIG. 7, in an exemplary embodiment of the present invention, the insulation structure 230 may further include a fast additional insulation layer 236. The first additional insulation layer 236 may be disposed between the insulation interlayer 235 and the planarization layer 237, and may cover the source and the drain electrodes 224 and 225. The first additional insulation layer 236 may insulate the pixel electrode 241 from the source electrode 224.

The conductive layer 120 may be disposed on the first gate insulation layer 232. In an exemplary embodiment of the present invention, the conductive layer 120 may be disposed on substantially the same level on the substrate 110 as the first gate electrode 222 in the display region 200.

The insulation layer 130 may be disposed on the conductive layer 120. The insulation layer 130 may be single layer structure or a multi-layer structure. In an exemplary embodiment of the present invention, the insulation layer 130 may include a first insulation layer 131, a second insulation layer 132 disposed on the first insulation layer 131, and a third insulation layer 133 disposed on the second insulation layer 132. The first insulation layer 131 may correspond to the second gate insulation layer 233, the second insulation layer 132 may correspond to the insulation interlayer 235, and the third insulation layer 133 may correspond to the first additional insulation layer 236. For example, the first insulation layer 131 may be a portion of the second gate insulation layer 233 that extends from the display region 200 to the peripheral region 100, the second insulation layer 132 may be a portion of the insulation interlayer 235 that extends from the display region 200 to the peripheral region 100, and the third insulation layer 133 may be a portion of the first additional insulation layer 236 that extends from the display region 200 to the peripheral region 100. For example, the first, second and third insulation layers 131, 132, 133 may be disposed on the same layer as the second gate insulation layer 233, insulation interlayer 235 and first additional insulation layer 236, respectively.

Figure 8:
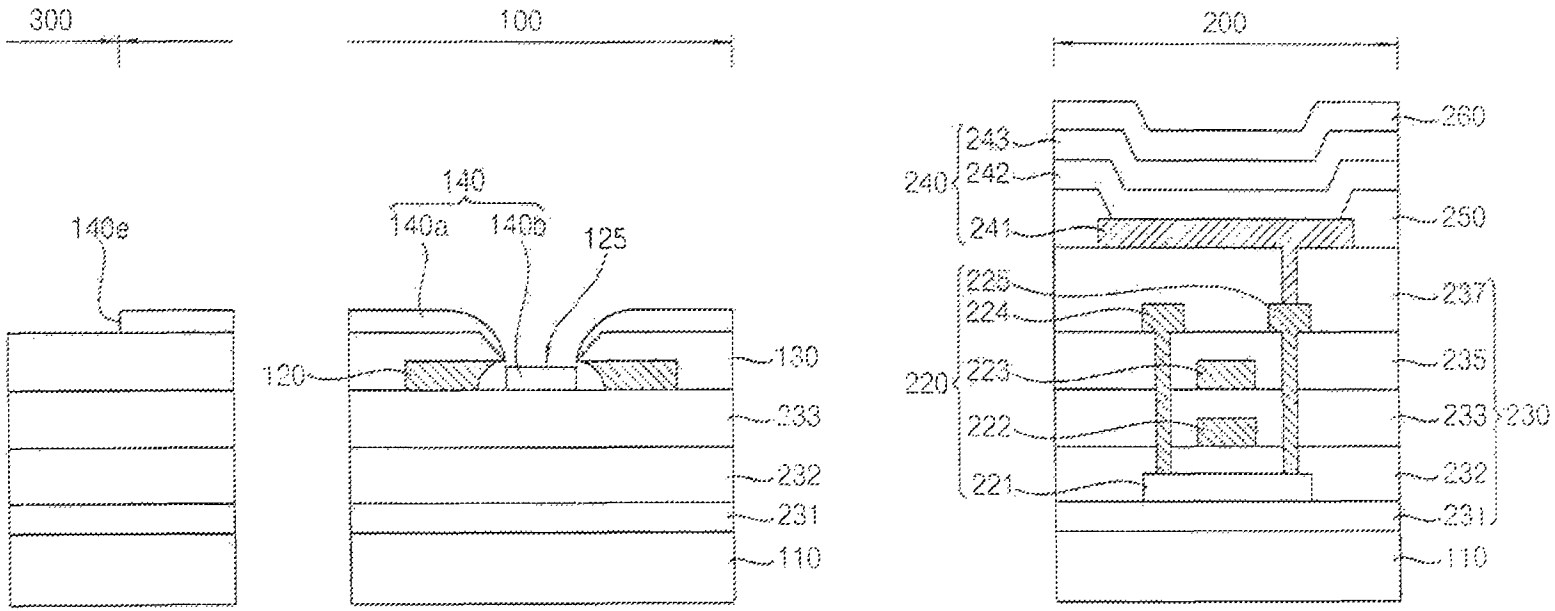

As illustrated in FIG. 8, the conductive layer 120 may be disposed on the second gate insulation layer 233. In an exemplary embodiment of the present invention, the conductive layer 120 in the peripheral region 100 may be disposed on substantially the same level on the substrate 110 with the second gate electrode 223 in the display region 200.

The insulation layer 130 may be disposed on the conductive layer 120. In an exemplary embodiment of the present invention, the insulation layer 130 may correspond to the insulation interlayer 235. For example, the insulation layer 130 may be a portion of the insulation interlayer 235 that extends from the display region 200 to the peripheral region 100.

Figure 9:
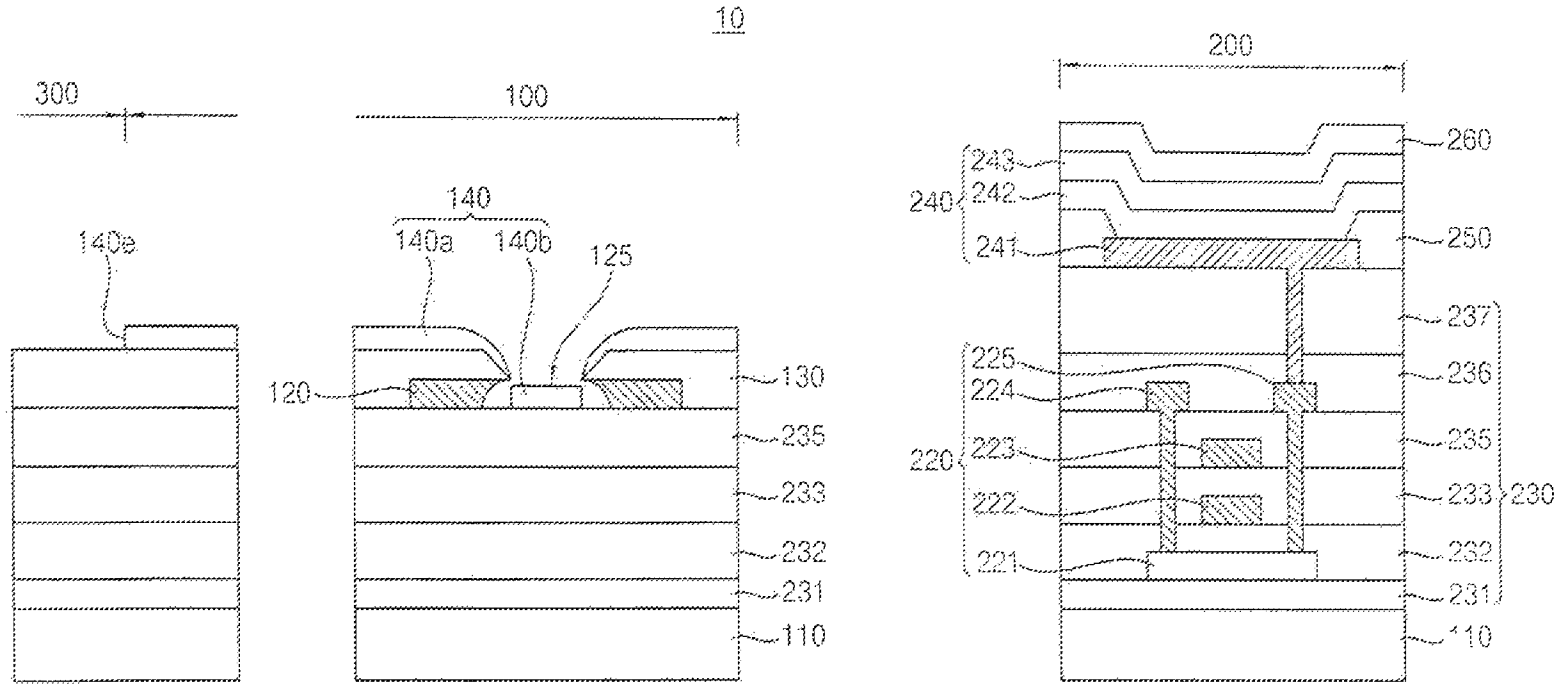

As illustrated in FIG. 9, in an exemplary embodiment of the present invention, the insulation structure 230 may include a first additional insulation layer 236. As described with reference to FIG. 7, the first additional insulation layer 236 may be disposed between the insulation interlayer 235 and the planarization layer 237, and may cover the source and the drain electrodes 224 and 225. Further, a via may penetrate the planarization layer 237 and the first additional insulation layer 236 to connect the pixel electrode 241 to the drain electrode 225.

The conductive layer 120 may be disposed on the insulation interlayer 235. In an exemplary embodiment of the present invention, the conductive layer 120 in the peripheral region 100 may be disposed on substantially the same level on the substrate 110 as the source and the drain electrodes 224 and 225 in the display region 200.

The insulation layer 130 may be disposed on the conductive layer 120. For example, the insulation layer 130 may cover the conductive layer 120. In an exemplary embodiment of the present invention, the insulation layer 130 may correspond to the first additional insulation layer 236. For example, the insulation layer 130 may be a portion of the first additional insulation layer 236 that extends from the display region 200 to the peripheral region 100.

Figure 10:
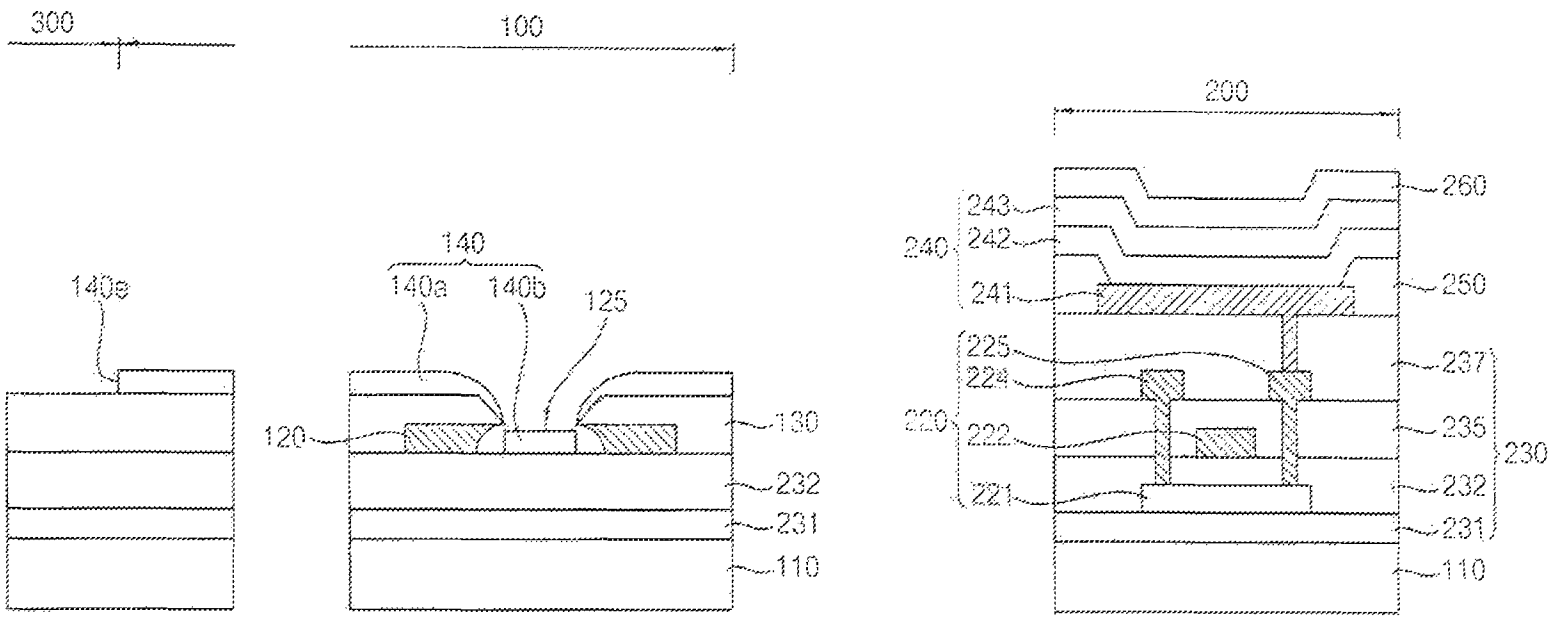

As illustrated in FIG. 10, in an exemplary embodiment of the present invention, a switching structure 220 may include an active pattern 221, a gate electrode 222, a source electrode 224, and a drain electrode 225. An insulation structure 230 may include a buffer layer 231, a gate insulation layer 232, an insulation interlayer 235, and a planarization layer 237. For example, the previously mentioned layers of the insulation structure 230 may be sequentially stacked. Compared to the OLED device 10 illustrated in FIG. 3, according to an exemplary embodiment of the present invention, the second gate insulation layer 233 and the second gate electrode 223 may be omitted in the OLED device 10 illustrated in FIG. 10.

The conductive layer 120 may be disposed on the gate insulation layer 232. In an exemplary embodiment of the present invention, the conductive layer 120 in the peripheral region 100 may be disposed on substantially the same level on the substrate 110 as the gate electrode 222 in the display region 200.

The insulation layer 130 may be disposed on the conductive layer 120. In an exemplary embodiment of the present invention, the insulation layer 130 may correspond to the insulation interlayer 235. For example, the insulation layer 130 may be a portion of the insulation interlayer 235 that extends from the display region 200 to the peripheral region 100.

Figure 11:
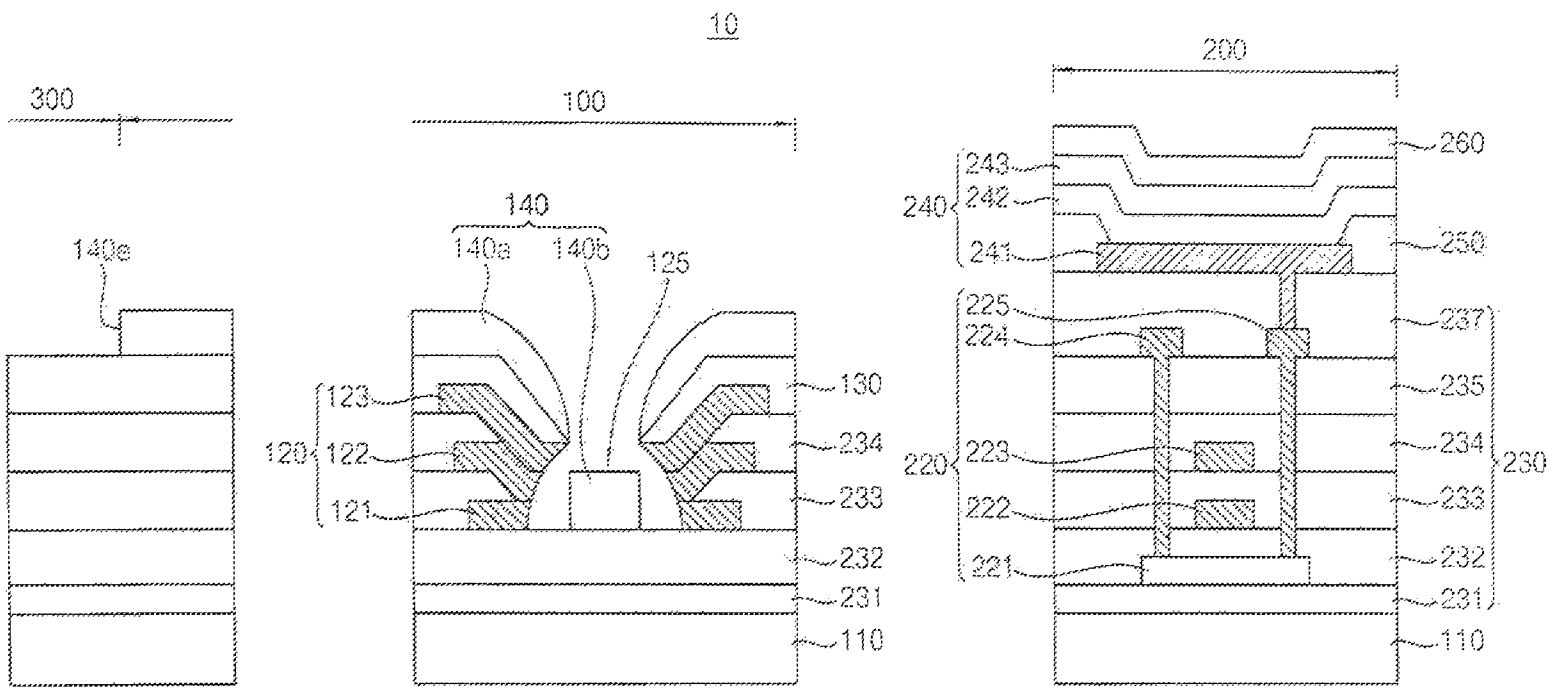
FIGS. 11 and 12 are cross-sectional views illustrating an OLED device according to an exemplary embodiment of the present invention.
Figure 12:
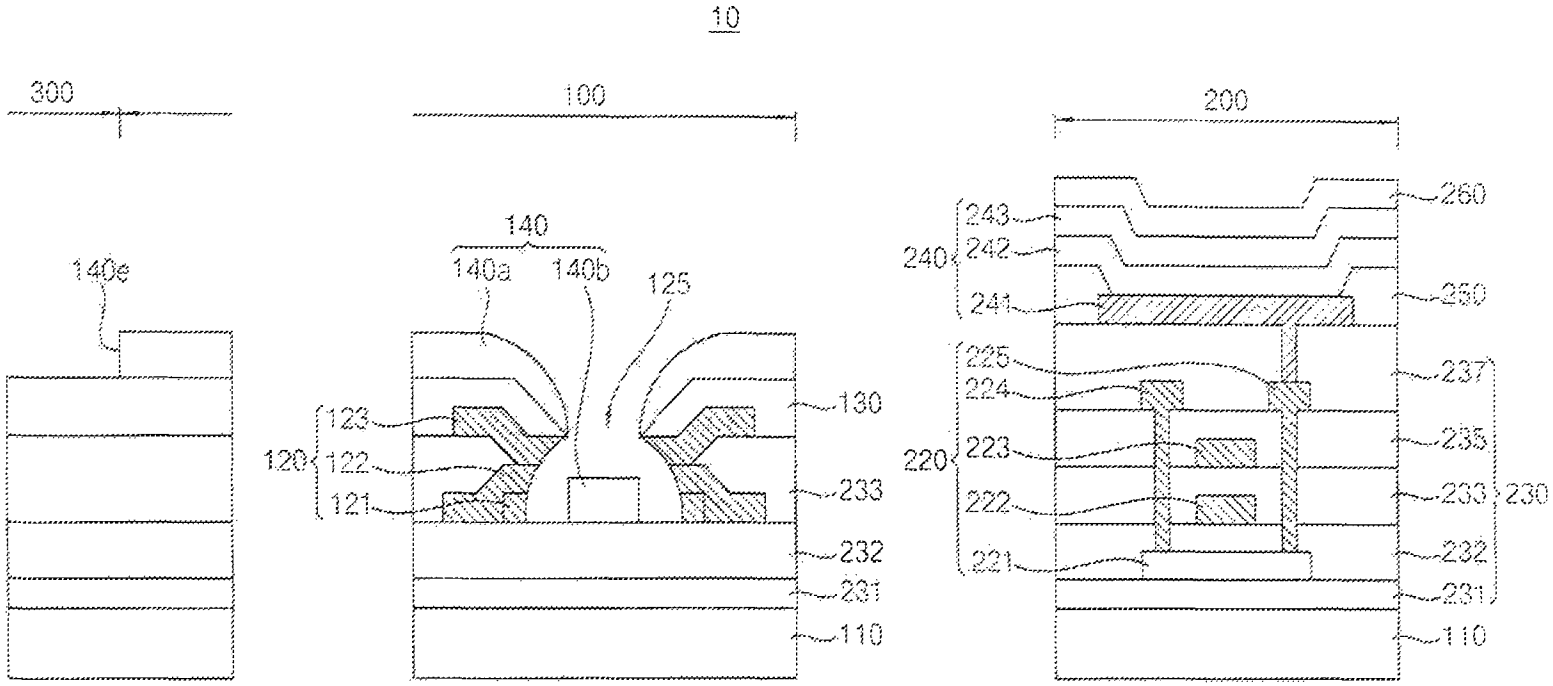

FIGS. 11 and 12 are cross-sectional views illustrating an OLED device according to an exemplary embodiment of the present invention.

Referring to FIGS. 11 and 12, the conductive layer 120 may be disposed on the substrate 110. As described above, the opening portion 125 may be formed in the conductive layer 120, and the conductive layer 120 may have an undercut shape. Unlike the OLED device 10 according to exemplary embodiments with reference to FIG. 3, the OLED device 10 according to some exemplary embodiments with reference to FIGS. 11 and 12 may include the conductive layer 120 including three conductive layers 121, 122, and 123.

As illustrated in FIG. 11, in an exemplary embodiment of the present invention, the insulation structure 230 may include a second additional insulation layer 234. The second additional insulation layer 234 may be disposed between the second gate insulation layer 233 and the insulation interlayer 235, and may cover the second gate electrode 223. The second additional insulation layer 234 may insulate the source and the drain electrodes 224 and 225 from the second gate electrode 223.

In an exemplary embodiment of the present invention, the conductive layer 120 may include a first conductive layer 121, a second conductive layer 122, and a third conductive layer 123. For example, the first conductive layer 121 may be disposed on the first gate insulation layer 232. The second gate insulation layer 233 may be disposed on the first gate insulation layer 232, and may partially cover the first conductive layer 121. A first opening may be formed in the second gate insulation layer 233. The first opening may expose a portion of the first conductive layer 121. The second conductive layer 122 may be disposed on the second gate insulation layer 233. The second conductive layer 122 may be in contact with the first conductive layer 121 through the first opening. The second additional insulation layer 234 may be disposed on the second gate insulation layer 233, and may partially cover the second conductive layer 122. A second opening may be formed in the second additional insulation layer 234. The second opening may expose at least a portion of the second conductive layer 122. The third conductive layer 123 may be disposed on the second additional insulation layer 234. The third conductive layer 123 may be in contact with the second conductive layer 122 through the second opening.

The insulation layer 130 may be disposed on the conductive layer 120. For example, the insulation layer 130 may be disposed on the second additional insulation layer 234, and may cover the conductive layer 120. For example, the insulation layer 130 may be disposed on the second additional insulation layer 234 such that the third conductive layer 123 is covered.

In an exemplary embodiment of the present invention, the first conductive layer 121 and the second conductive layer 122 in the peripheral region 100 may be disposed on substantially the same level on the substrate 110 as the first gate electrode 222 and the second gate electrode 223, respectively, in the display region 200. The insulation layer 130 may correspond to the insulation interlayer 235. For example, the insulation layer 130 may be a portion of the insulation interlayer 235 that extends from the display region 200 to the peripheral region 100.

As illustrated in FIG. 12, in an exemplary embodiment of the present invention, the conductive layer 120 may include a first conductive layer 121, a second conductive layer 122, and a third conductive layer 123. For example, the first conductive layer 121 may be disposed on the first gate insulation layer 232. The second conductive layer 122 may be disposed on the first gate insulation layer 232, and may at least partially cover the first conductive layer 121. The second gate insulation layer 233 may be disposed on the first gate insulation layer 232, and may partially cover the second conductive layer 122. A opening may be formed in the second gate insulation layer 233. The opening may expose a portion of the second conductive layer 122. The third conductive layer 123 may be disposed on the second gate insulation layer 233. The third conductive layer 123 may be in contact with the second conductive layer 122 through the opening.

The insulation layer 130 may be disposed on the conductive layer 120. For example, the insulation layer 130 may be disposed on the second gate insulation layer 233, and may at least partially cover the conductive layer 120.

In an exemplary embodiment of the present invention, the second conductive layer 122 and the third conductive layer 123 in the peripheral region 100 may be disposed on substantially the same level on the substrate 110 as the first gate electrode 222 and the second gate electrode 223, respectively, in the display region 200. Further, the first conductive layer 121 in the peripheral region 100 may be disposed on substantially the same level as the first gate electrode 222. The insulation layer 130 may correspond to the insulation interlayer 235. For example, the insulation layer 130 may be a portion of the insulation interlayer 235 that extends from the display region 200 to the peripheral region 100.

FIGS. 13 to 19 are cross-sectional views illustrating a method of manufacturing an OLED device according to exemplary embodiments of the present invention.

Figure 13:
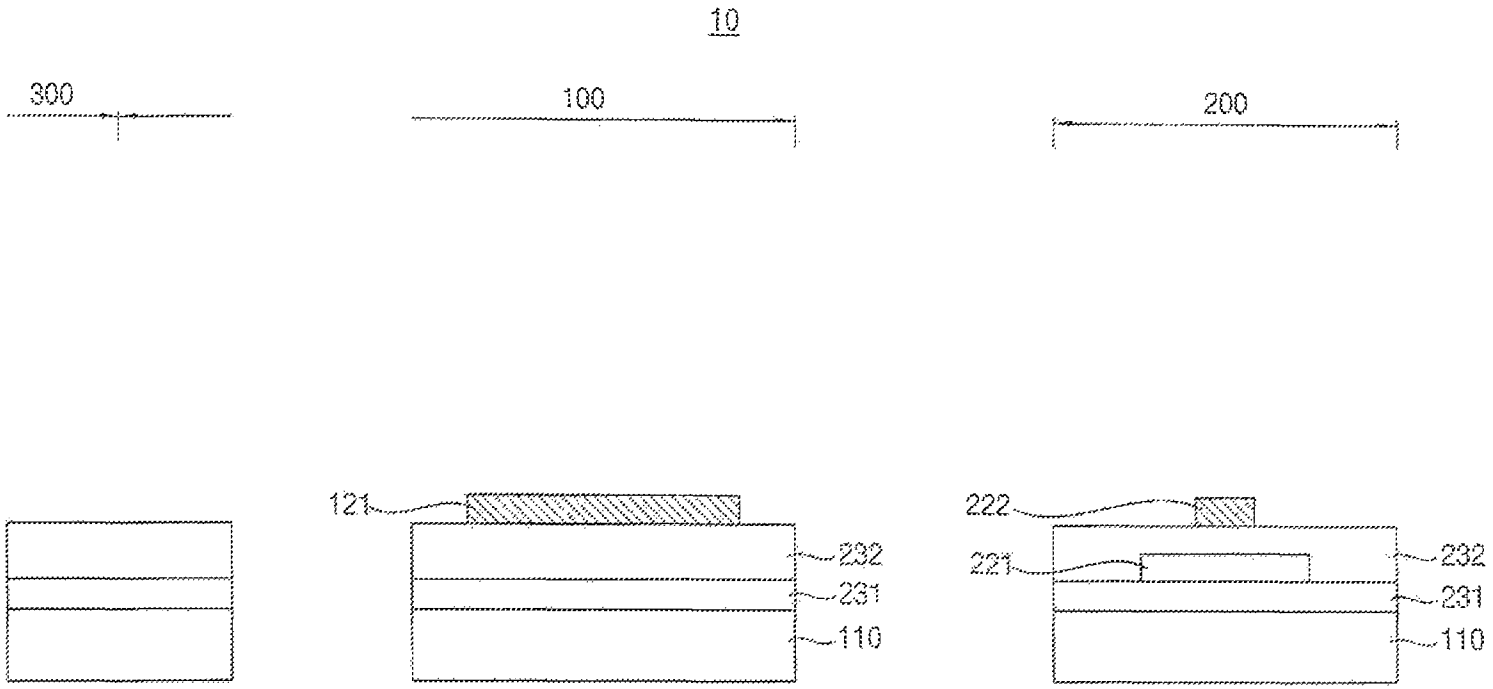
FIGS. 13 to 19 are cross-sectional views illustrating a method of manufacturing an OLED device according to an exemplary embodiment of the present invention.

Referring to FIG. 13, the substrate 110 may be prepared. The buffer layer 231 may be formed on the substrate 110. The active pattern 221 may be formed on the buffer layer 231 in the display region 200. The first gate insulation layer 232 may be formed on the buffer layer 231 such that the active pattern 221 is covered.

A first preliminary conductive layer may be formed on the first gate insulation layer 232. The first gate electrode 222 in the display region 200 and the first conductive layer 121 in the peripheral region 100 may be formed by patterning the first preliminary conductive layer.

Figure 14:
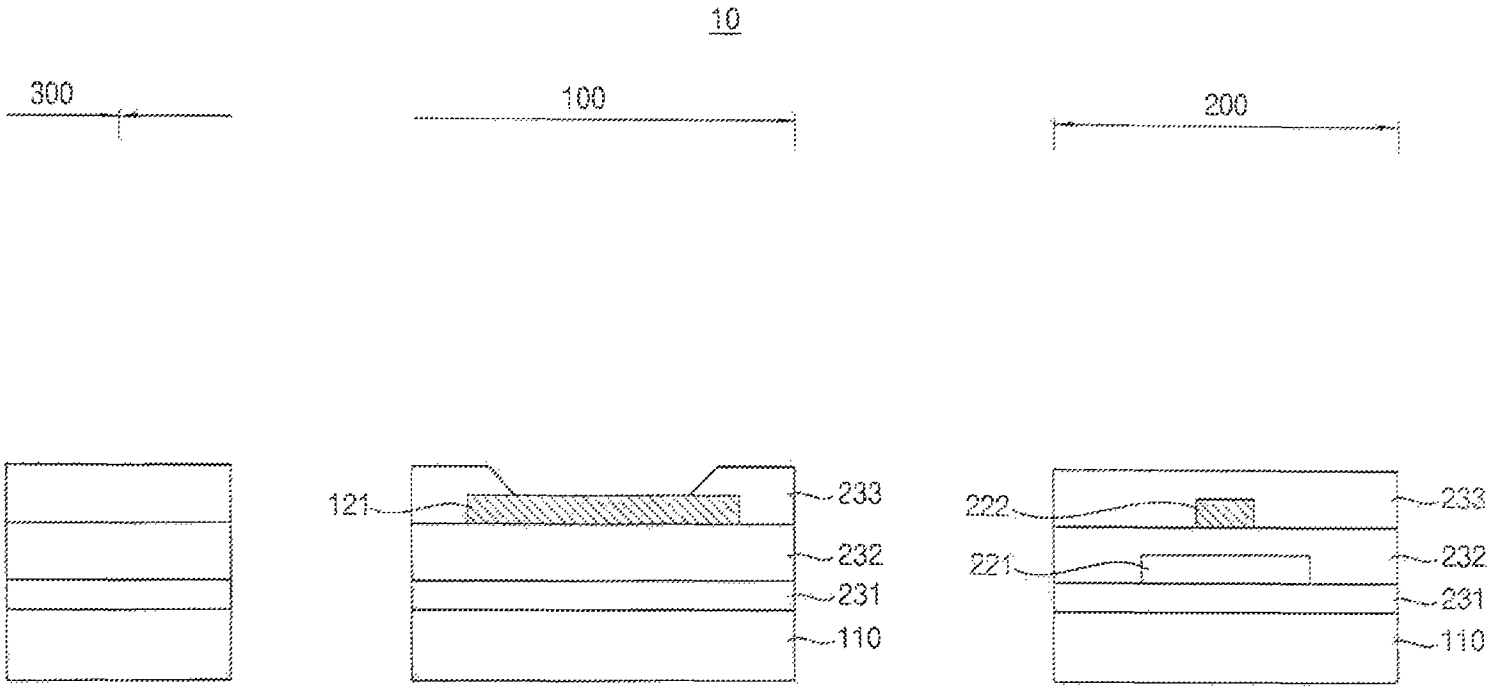

Referring to FIG. 14, the second gate insulation layer 233 may be formed on the first gate insulation layer 232 to cover the first gate electrode 222 in the display region 200 and to cover the first conductive layer 121 in the peripheral region 100. The second gate insulation layer 233 may be patterned to form an opening that exposes a portion of the first conductive layer 121.

Figure 15:
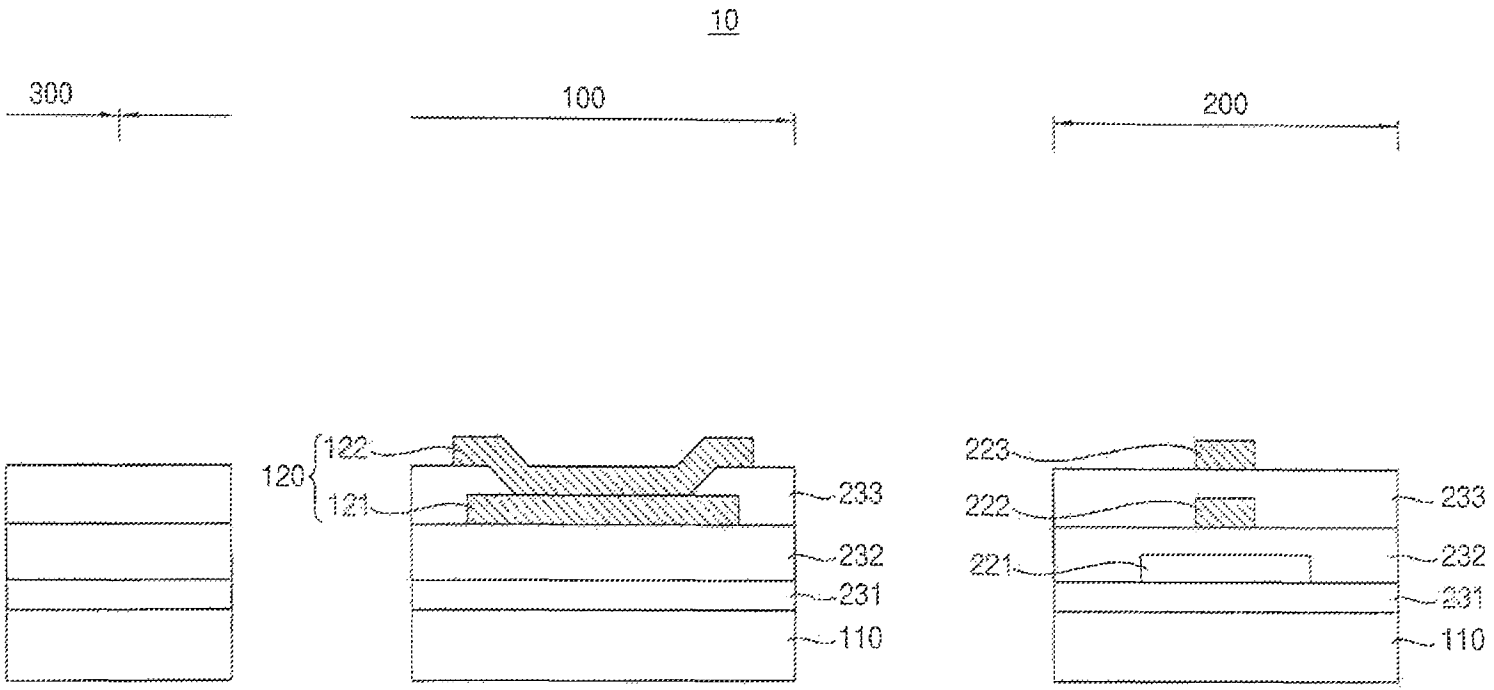

Referring to FIG. 15, a second preliminary conductive layer may be formed on the second gate insulation layer 233 and the exposed first conductive layer 121. The second gate electrode 223 in the display region 200 and the second conductive layer 122 in the peripheral region 100 may be formed by patterning the second preliminary conductive layer. For example, the second conductive layer 122 may partially cover the second gate insulation layer 233 in the peripheral region 100. Therefore, the conductive layer 120 may be provided on the substrate 110. For example, the first conductive layer 121 and the second conductive layer 122 may be in contact with each other through the opening.

Figure 16:
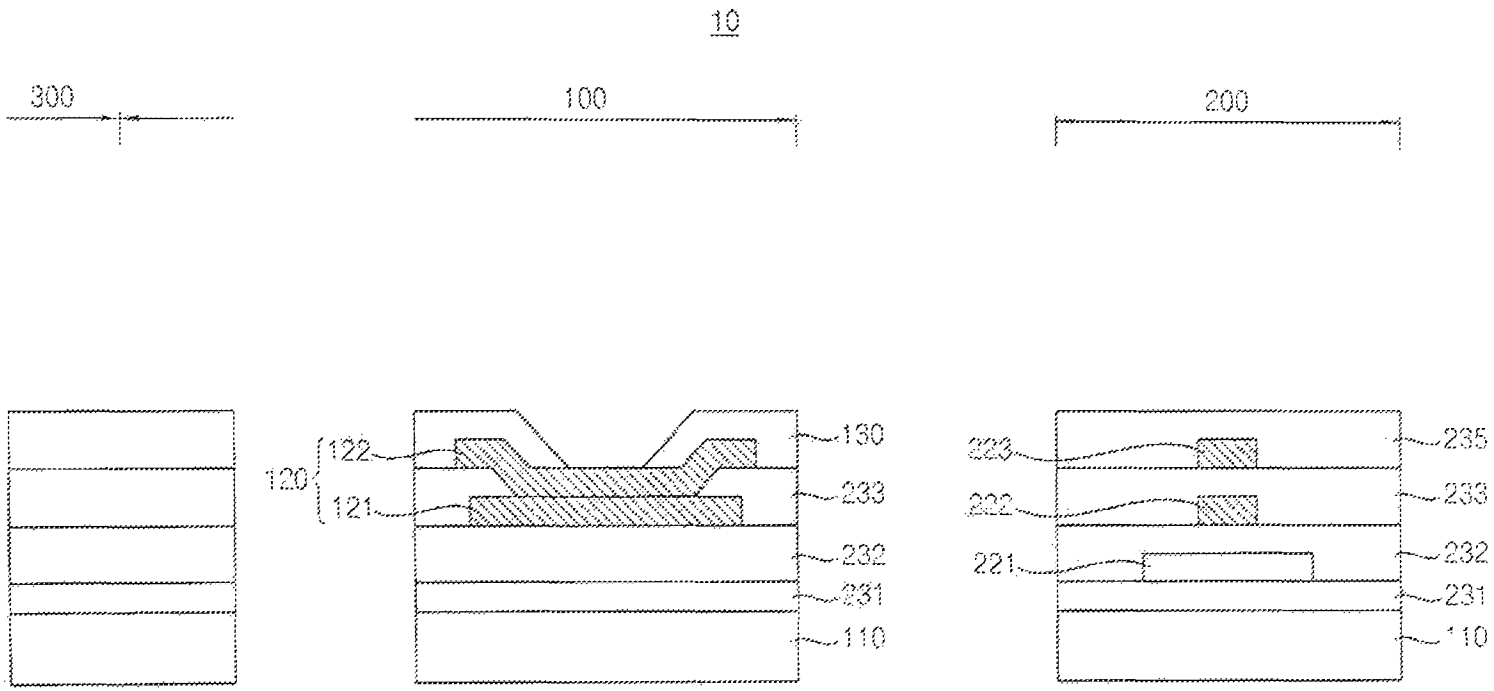

Referring to FIG. 16, the insulation interlayer 235 may be formed on the second gate insulation layer 233 to cover the second gate electrode 223 and the second conductive layer 122. The insulation interlayer 235 may be patterned to form an opening that exposes a portion of the second conductive layer 122. For example, the opening formed in the insulation interlayer 235 may be formed with a width that substantially decreases from an upper potion to a lower portion. Therefore, the insulation layer 130 covering the conductive layer 120 may be provided in the peripheral region 100. For example, the insulation layer 130 may be a portion of the insulation interlayer 235 that extends from the display region 200 to the peripheral region 100.

Figure 17:
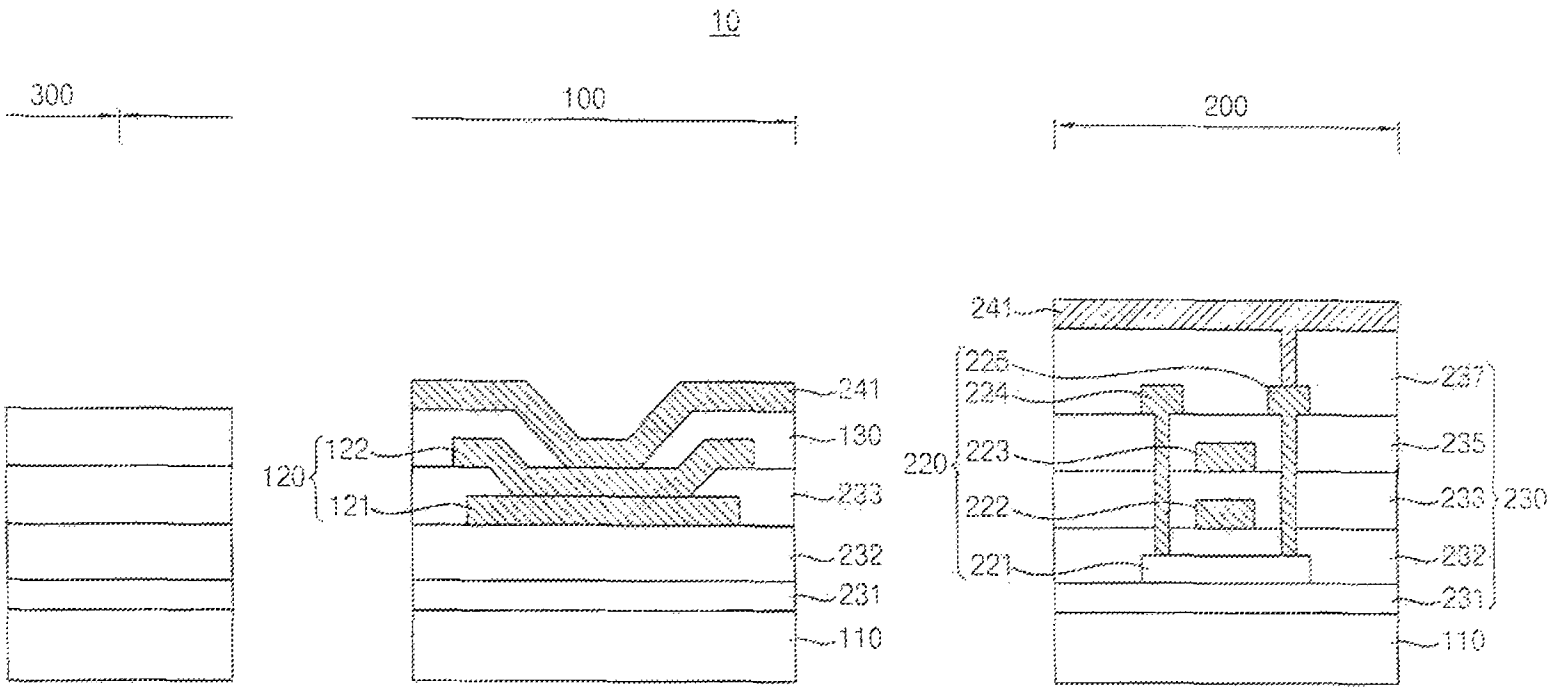

Referring to FIG. 17, portions of the first gate insulation layer 232, the second gate insulation layer 233, and the insulation interlayer 235 in the display region 200 may be removed to form contact holes that expose portions of the active pattern 221. The source electrode 224 and the drain electrode 225 which fill the contact holes, respectively, may be formed on the insulation interlayer 235 in the display region 200. The planarization layer 237 may be formed on the insulation interlayer 235 in the display region 200 such that it covers the source electrode 224 and the drain electrode 225. Further, the planarization layer 237 may provide a flat top surface above the source electrode 224 and the drain electrode 225. A portion of the planarization layer 237 may be removed to form a via hole that exposes a portion of the drain electrode 225. The third preliminary conductive layer that fills the via hole may be formed on the planarization layer 237 in the display region 200, on the insulation layer 130, and on the exposed second conductive layer 122 in the peripheral region 200.

Figure 18:
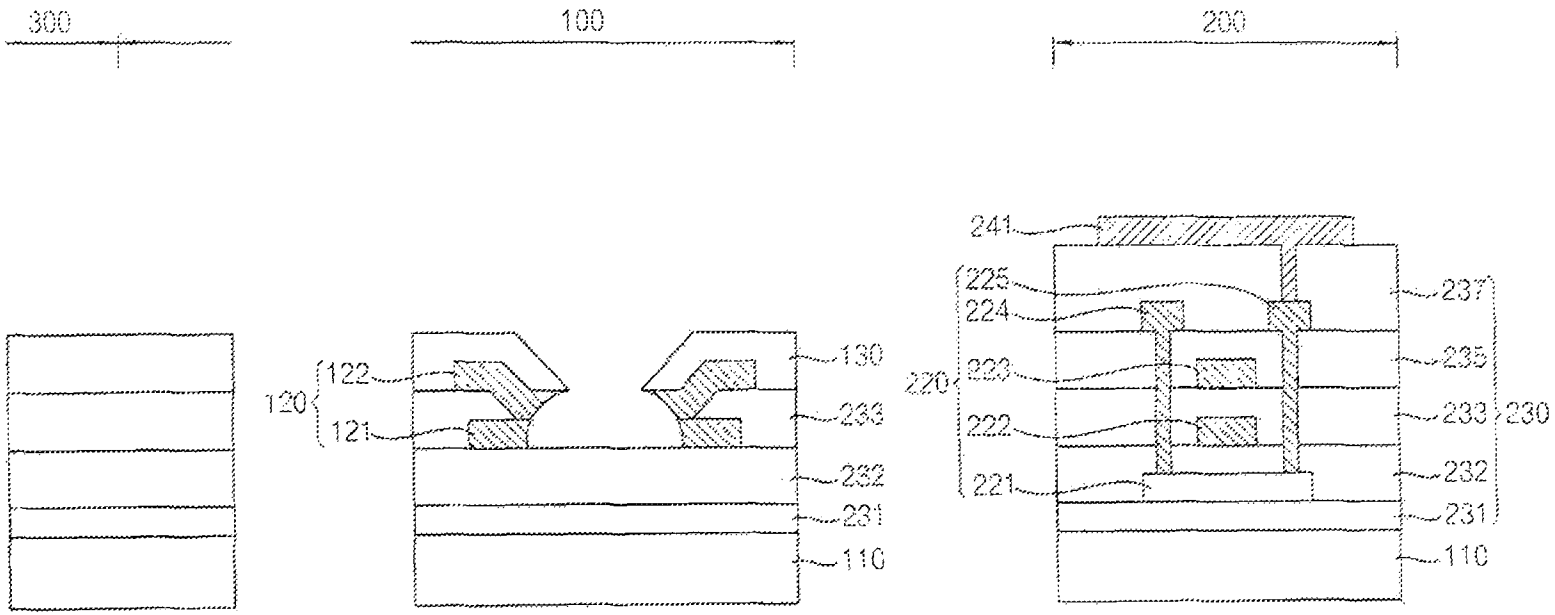

Referring to FIG. 18, the third preliminary conductive layer may be patterned by using an etchant. The third preliminary conductive layer in the display region 200 may be patterned to form the pixel electrode 241 in the display region 200. The third preliminary conductive layer in the peripheral region 100 may be fully removed. Further, the conductive layer 120 may be patterned by using the etchant to form the opening portion 125 in the conductive layer 120. For example, the first gate insulation layer 232 may be exposed by the opening portion 125. Here, the conductive layer 120 may be patterned to have a substantial undercut shape. For example, a width of the opening portion 125 may decrease from an upper portion to a lower portion.

The third preliminary conductive layer and the conductive layer 120 may be simultaneously etched by the etchant. For example, the pixel electrode 241 and the conductive layer 120 may be etched simultaneously. For example, each of the pixel electrode 241 and the conductive layer 120 may have a material etched by the same etchant.

Figure 19:
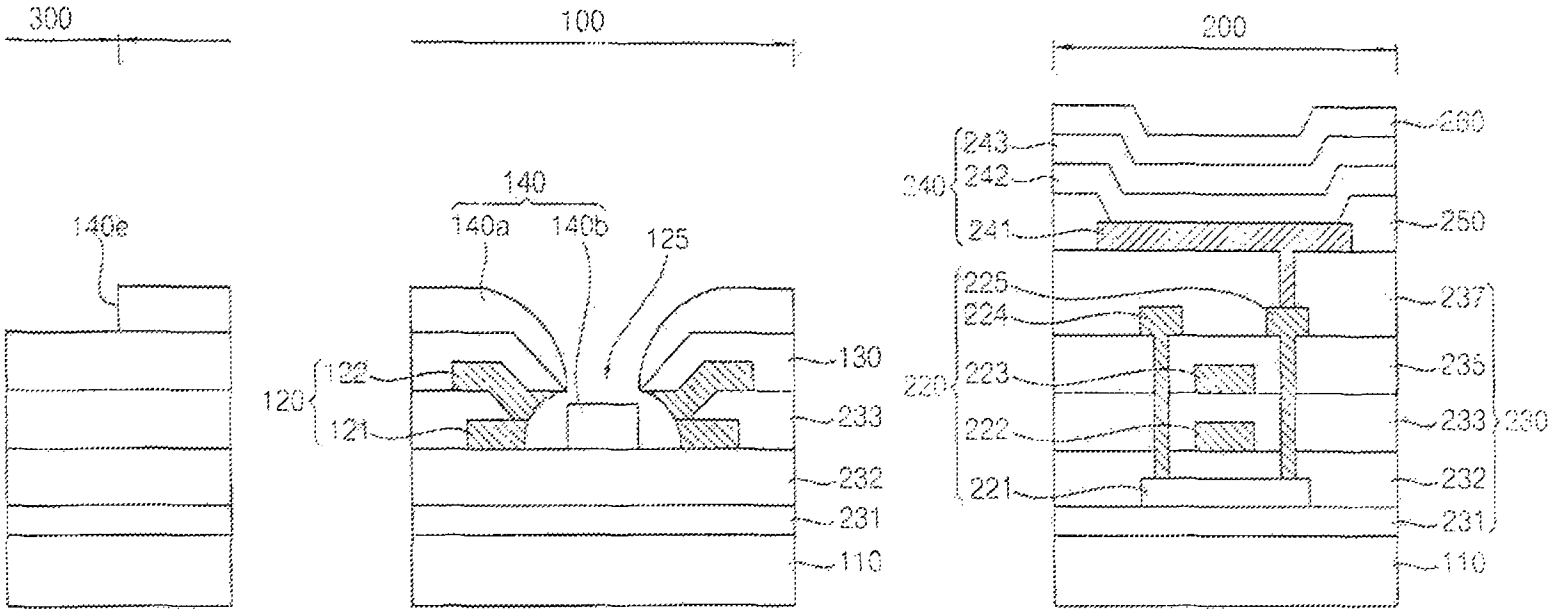

Referring to FIG. 19, the pixel defining layer 250 may be formed on the planarization layer 237 to partially cover the pixel electrode 241. An opening may be formed in the pixel defining layer 250 to expose a portion of the pixel electrode 241. The display layer 242, the opposing electrode 243, and the capping layer 260 may be sequentially formed on the pixel defining layer 250 and the exposed pixel electrode 241.

In an exemplary embodiment of the present invention, at least one of the display layer 242, the opposing electrode 243, and the capping layer 260 may be formed in the peripheral region 100. Therefore, the common layer 140 that includes at least one of the display layer 242, the opposing electrode 243, and the capping layer 260 may be formed in the peripheral region 100. The common layer 140 may include the first portion 140a disposed on the insulation layer 130, and the second portion 140b disposed on the first gate insulation layer 232 that is exposed by the opening portion 125.

The second portion 140b of the common layer 140 may be spaced apart from the first portion 140a of the common layer 140. The first portion 140a of the common layer 140 may be disposed on the patterned insulation layer 130 and along a side wall of the patterned insulation layer 130 extending toward the opening portion 125; however, the first portion 140a might not be disposed on a side wall of the conductive layer 120 that has an undercut shape. Therefore, the common layer 140 may be divided into the first and the second portions 140a and 140b.

In an exemplary embodiment of the present invention, the thickness of the conductive layer 120 may be greater than the thickness of the common layer 140. For example, the difference of height between a bottom of the first portion 140a of the common layer 140 and a top of the first gate insulation layer 232 may be greater than or equal to the thickness of the conductive layer 120. Thus, the first portion 140a of the common layer 140 may be spaced apart from the second portion 140b of the common layer 140 disposed in the opening portion 125 that has the thickness less than that of the conductive layer 120.

The OLED device according to an exemplary embodiment of the present invention may be applied to a display device included in a computer, a notebook, a mobile phone, a smartphone, a smart pad, a PMP, a PDA, an MP3 player, or the like.

While the present inventive concept has been particularly shown and described with reference to exemplary embodiments thereof, it will be apparent to those of ordinary skill in the art that various changes in form and detail may be made thereto without departing from the spirit and scope of the present inventive concept as defined by the following claims.

What is claimed is:

1. An organic light emitting display (OLED) device, comprising:

a first insulation layer disposed on a substrate;

a second insulation layer disposed on the first insulation layer;

a conductive layer disposed on the second insulation layer, wherein the second insulation layer and the conductive layer include an opening portion on the first insulation layer; and a display layer disposed on both the conductive layer and the first insulation layer exposed by the opening portion, wherein the second insulation layer and the conductive layer are exposed by a sidewall of the opening portion, wherein the conductive layer protrudes inward of the opening portion than the second insulation layer, and wherein the display layer is disconnected by the opening portion.

2. The OLED device of claim 1, wherein the display layer does not cover at least a portion of the sidewall of the opening portion.

3. The OLED device of claim 1, further comprising a third insulation layer between the conductive layer and the display layer, wherein at least a portion of a bottom surface of the third insulation layer is exposed by the opening portion.

4. The OLED device of claim 1, wherein the substrate includes a display region, an opening region inside the display region, and a peripheral region between the display region and the opening region, and wherein the opening portion is disposed in the peripheral region.

5. The OLED device of claim 4, further comprising:

a switching structure disposed in the display region on the substrate, the switching structure comprising an active pattern, a first gate electrode, and a second gate electrode which are sequentially stacked on the substrate; and an insulation structure disposed on the substrate, the insulation structure comprising a first gate insulation layer disposed between the active pattern and the first gate electrode, and a second gate insulation layer dispose between the first gate electrode and the second gate electrode.

6. The OLED device of claim 5, wherein the conductive layer is disposed on a same level as the second gate electrode, and wherein the second insulation layer corresponds to the second gate insulation layer.

7. The OLED device of claim 5, wherein the first insulation layer corresponds to the first gate insulation layer.

8. The OLED device of claim 1, wherein the display layer includes an organic light emitting layer.

*9. An organic light emitting display (OLED) device, comprising a display region, an opening region inside the display region, and a boundary region between the display region and the opening region,*

*wherein the boundary region comprises:*

*an insulation layer disposed on a substrate, the insulation layer including a first region and a second region adjacent to the first region;*

*a conductive layer comprising at least two layers disposed between the insulation layer in the first region and a pixel electrode in the display region and including at least one of titanium (Ti) and aluminum (Al); and*

*a common layer disposed on the conductive layer that is disposed over the insulation layer in the first region and on the insulation layer in the second region, and*

*wherein the common layer disposed on the conductive layer that is disposed over the insulation layer in the first region is disconnected from the common layer disposed on the insulation layer in the second region.*

*10. The OLED device of claim 9, wherein a thickness of the conductive layer is greater than a thickness of the common layer.*

*11. The OLED device of claim 9, wherein the conductive layer includes a first portion and a second portion protruding from the first portion toward the common layer disposed on the insulation layer in the second region.*

*12. The OLED device of claim 11, wherein the second portion is spaced apart from the insulation layer.*

*13. The OLED device of claim 11, wherein the conductive layer includes a first conductive layer disposed on the insulation layer and a second conductive layer disposed on the first conductive layer.*

*14. The OLED device of claim 13, wherein the second conductive layer includes the second portion.*

*15. The OLED device of claim 9, wherein the display region comprises:*

*a switching structure disposed on the substrate, the switching structure comprising an active pattern, a gate electrode, a source electrode, and a drain electrode stacked on the substrate;*

*an organic light emitting structure disposed on the switching structure, the organic light emitting structure comprising the pixel electrode, a display layer, and an opposing electrode sequentially stacked on the switching structure; and*

*a capping layer disposed on the organic light emitting structure.*

*16. The OLED device of claim 15, wherein the conductive layer is disposed on a same level as the source or the drain electrode on the substrate.*

*17. The OLED device of claim 15, wherein the conductive layer is disposed on a same level as the gate electrode on the substrate.*

*18. The OLED device of claim 15, wherein the pixel electrode corresponds to an anode.*

*19. The OLED device of claim 15, wherein the common layer corresponds to at least one of the display layer, the opposing electrode, and the capping layer.*

*20. The OLED device of claim 15, wherein the common layer includes a first common layer and a second common layer disposed on the first common layer, and*

*wherein the first common layer and the second common layer correspond to the display layer and the opposing electrode, respectively.*

*21. The OLED device of claim 15, wherein the display layer includes an organic light emitting layer.*

*22. The OLED device of claim 9, wherein the conductive layer is not disposed on the insulation layer in the second region.*

*23. An organic light emitting display (OLED) device, comprising a display region, an opening region inside the display region, and a boundary region between the display region and the opening region,*

*wherein the boundary region comprises:*

*an insulation layer disposed on a substrate;*

*a first conductive pattern disposed on the insulation layer;*

*a second conductive pattern disposed on the insulation layer and spaced apart from the first conductive pattern, wherein each of the first conductive pattern and the second conductive pattern comprises at least two layers disposed between the insulation layer in the boundary region and a pixel electrode in the display region and includes at least one of titanium (Ti) and aluminum (Al); and*

*a common layer disposed on the first conductive pattern, the second conductive pattern, and the insulation layer between the first conductive pattern and the second conductive pattern, and*

*wherein the common layer disposed on the insulation layer is disconnected from the common layer on the first conductive pattern and the common layer on the second conductive pattern.*

*24. The OLED device of claim 23, wherein a thickness of the first conductive pattern and a thickness of the second conductive pattern are greater than a thickness of the common layer.*

*25. The OLED device of claim 23, wherein each of the first conductive pattern and the second conductive pattern includes a first portion and a second portion protruding from the first portion toward the common layer disposed on the insulation layer between the first conductive pattern and the second conductive pattern.*

*26. The OLED device of claim 25, wherein the second portion is spaced apart from the insulation layer.*

*27. The OLED device of claim 25, wherein each of the first conductive pattern and the second conductive pattern includes a first conductive layer disposed on the insulation layer and a second conductive layer disposed on the first conductive layer.*

*28. The OLED device of claim 27, wherein the second conductive layer includes the second portion.*

*29. The OLED device of claim 23, wherein the common layer disposed on the insulation layer between the first conductive pattern and the second conductive pattern is spaced apart from the first conductive pattern and the second conductive pattern.*

*30. The OLED device of claim 23, wherein the display region comprises:*

*a switching structure disposed on the substrate, the switching structure comprising an active pattern, a gate electrode, a source electrode, and a drain electrode stacked on the substrate;*

*an organic light emitting structure disposed on the switching structure, the organic light emitting structure comprising the pixel electrode, a display layer, and an opposing electrode sequentially stacked on the switching structure; and*

*a capping layer disposed on the organic light emitting structure.*

*31. The OLED device of claim 30, wherein each of the first conductive pattern and the second conductive pattern is disposed on a same level as the source or the drain electrode on the substrate.*

*32. The OLED device of claim 30, wherein each of the first conductive pattern and the second conductive pattern is disposed on a same level as the gate electrode on the substrate.*

*33. The OLED device of claim 30, wherein the pixel electrode corresponds to an anode.*

*34. The OLED device of claim 30, wherein the common layer corresponds to at least one of the display layer, the opposing electrode, and the capping layer.*

*35. The OLED device of claim 30, wherein the common layer includes a first common layer and a second common layer disposed on the first common layer, and*

*wherein the first common layer and the second common layer correspond to the display layer and the opposing electrode, respectively.*

*36. The OLED device of claim 30, wherein the display layer includes an organic light emitting layer.*

* * * * *